US008268118B2

(12) United States Patent
Lee et al.

(10) Patent No.: US 8,268,118 B2
(45) Date of Patent: *Sep. 18, 2012

(54) CRITICAL DIMENSION REDUCTION AND ROUGHNESS CONTROL

(75) Inventors: Sangheon Lee, Dublin, CA (US); Dae-Han Choi, Sunnyvale, CA (US); Jisoo Kim, Pleasanton, CA (US); Peter Cirigliano, Sunnyvale, CA (US); Zhisong Huang, Fremont, CA (US); Robert Charatan, Portland, OR (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 254 days.

This patent is subject to a terminal disclaimer.

(21) Appl. No.: 12/711,420

(22) Filed: Feb. 24, 2010

(65) Prior Publication Data

US 2010/0148317 A1  Jun. 17, 2010

Related U.S. Application Data

(62) Division of application No. 11/142,509, filed on May 31, 2005, now Pat. No. 7,695,632.

(51) Int. Cl.
*H01L 21/3065* (2006.01)

(52) U.S. Cl. ............... 156/345.38; 156/345.43; 257/622; 257/E21.577; 438/702

(58) Field of Classification Search ............ 156/345.26, 156/345.38, 345.43; 257/622, E21.577, E29.106; 438/702
See application file for complete search history.

(56) References Cited

U.S. PATENT DOCUMENTS

| 4,707,218 | A | * | 11/1987 | Giammarco et al. ......... 438/421 |
| 4,801,350 | A | * | 1/1989 | Mattox et al. ................ 438/702 |
| 5,259,909 | A | * | 11/1993 | de Villeneuve et al. . 156/345.26 |
| 5,273,609 | A | * | 12/1993 | Moslehi .................... 156/345.28 |
| 5,895,740 | A | * | 4/1999 | Chien et al. .................. 430/313 |
| 5,902,494 | A | * | 5/1999 | Gupta et al. .................... 216/67 |
| 5,989,979 | A | | 11/1999 | Liu et al. |
| 6,106,659 | A | * | 8/2000 | Spence et al. ............ 156/345.43 |

(Continued)

FOREIGN PATENT DOCUMENTS

WO  WO 2005/122226  12/2005

OTHER PUBLICATIONS

Search Report dated Jun. 11, 2010 from Singapore Patent Application No. 200717740-5.

(Continued)

*Primary Examiner* — Allan R Wilson
(74) *Attorney, Agent, or Firm* — Beyer Law Group LLP

(57) ABSTRACT

A method for forming a feature in an etch layer is provided. A photoresist layer is formed over the etch layer. The photoresist layer is patterned to form photoresist features with photoresist sidewalls. A control layer is formed over the photoresist layer and bottoms of the photoresist features. A conformal layer is deposited over the sidewalls of the photoresist features and control layer to reduce the critical dimensions of the photoresist features. Openings in the control layer are opened with a control layer breakthrough chemistry. Features are etched into the etch layer with an etch chemistry, which is different from the control layer break through chemistry, wherein the control layer is more etch resistant to the etch with the etch chemistry than the conformal layer.

5 Claims, 8 Drawing Sheets

U.S. PATENT DOCUMENTS

| | | | |
|---|---|---|---|
| 6,110,837 | A | 8/2000 | Linliu et al. |
| 6,527,910 | B2 * | 3/2003 | Rossman ............... 156/345.43 |
| 6,617,253 | B1 * | 9/2003 | Chu et al. ................... 438/702 |
| 6,703,312 | B2 | 3/2004 | Golz et al. |
| 7,250,371 | B2 | 7/2007 | Kang et al. |
| 7,265,056 | B2 * | 9/2007 | Tsai et al. .................. 438/725 |
| 7,309,646 | B1 | 12/2007 | Heo et al. |
| 2003/0033979 | A1 * | 2/2003 | Kholodenko et al. ........ 118/715 |
| 2004/0192058 | A1 | 9/2004 | Chu et al. |
| 2005/0032354 | A1 | 2/2005 | Chu et al. |
| 2005/0048785 | A1 | 3/2005 | Kang et al. |
| 2008/0083502 | A1 * | 4/2008 | Heo et al. ................ 156/345.24 |
| 2010/0068885 | A1 * | 3/2010 | Cirigliano et al. ............ 438/703 |

OTHER PUBLICATIONS

Exam Report dated Jun. 11, 2010 from Singapore Patent Application No. 200717740-5.

International Search Report dated Jun. 10, 2008 from International Application No. PCT/US06/18142.

Written Opinion dated Jun. 10, 2008 from International Application No. PCT/US06/18142.

Office Action dated Apr. 29, 2009 from U.S. Appl. No. 11/142,509.

Notice of Allowance dated Nov. 24, 2009 from U.S. Appl. No. 11/142,509.

* cited by examiner

CRITICAL DIMENSION REDUCTION AND ROUGHNESS CONTROL

CROSS REFERENCE TO RELATED APPLICATIONS

This application is a division of U.S. patent application Ser. No. 11/142,509 entitled "Critical Dimension Reduction and Roughness Control," filed on May 31, 2005, by inventors Lee et al., which is incorporated herein by reference and from which priority under 35 U.S.C. §120 is claimed.

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARL (Anti-reflective layer) 110 over the layer 108 to be etched forming a stack 100. The photoresist pattern has a critical dimension (CD), which may be the width 116 of the smallest feature. Presently, for 248 nm photoresist a typical CD for the photoresist may be 230-250 nm using conventional processes. Due to optical properties dependent on wavelength, photoresist exposed by longer wavelength light has larger theoretical minimal critical dimensions.

A feature 120 may then be etched through the photoresist pattern, as shown in FIG. 1B. Ideally, the CD of the feature (the width of the feature) is equal to the CD 116 of the feature in the photoresist 112. In practice, the CD of the feature 116 may be larger than the CD of the photoresist 112 due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

In the etching of conductive layers, such as in the formation of memory devices, it is desirable to increase device density without diminishing performance.

SUMMARY OF THE INVENTION

To achieve the foregoing and in accordance with the purpose of the present invention a method for forming a feature in an etch layer is provided. A photoresist layer is formed over the etch layer. The photoresist layer is patterned to form photoresist features with photoresist sidewalls, where the photoresist features have a first critical dimension. A control layer is formed over the photoresist layer and bottoms of the photoresist features. A conformal layer is deposited over the sidewalls of the photoresist features and control layer to reduce the critical dimensions of the photoresist features. Openings in the control layer are opened with a control layer breakthrough chemistry. Features are etched into the etch layer with an etch chemistry, which is different from the control layer break through chemistry, wherein the etch layer features have a second critical dimension, which is less than the first critical dimension and wherein the control layer is more etch resistant to the etch with the etch chemistry than the conformal layer.

In another manifestation of the invention a method for forming a feature in an etch layer is provided. A wafer with an etch layer deposited below a patterned photoresist mask with photoresist features is placed into an etch chamber. A control layer is formed over the photoresist layer and bottoms of the photoresist features. A conformal layer is deposited over the sidewalls of the photoresist features and control layer to reduce the critical dimensions of the photoresist feature. Openings are etched in the control layer with a first etch chemistry. Features are etched into the etch layer with a second etch chemistry, which is different from the first etch chemistry, wherein the etch layer features have a second critical dimension, which is less than the first critical dimension and wherein the control layer is more etch resistant to the etch with the second etch chemistry than the conformal layer. The photoresist mask is stripped. The wafer is removed from the etch chamber.

In another manifestation of the invention, an apparatus for forming a feature in an etch layer, wherein the etch layer is supported by a substrate and wherein the etch layer is covered by a photoresist mask with photoresist features with a first CD is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet. The gas source comprises a control layer gas source, a deposition gas source, a profile shaping gas source, and an etchant gas source. A controller is controllably connected to the gas source and the at least one electrode. The controller comprises at least one processor and computer readable media. The computer readable media comprises computer readable code for providing a control layer, computer readable code for providing at least two deposition cycles to form a sidewall deposition on a photoresist mask and the control layer to form features with a second CD, within the photoresist features, and computer readable code for providing a flow of an etchant gas from the etchant gas source to the plasma processing chamber after completion of the at least three deposition cycles, and computer readable code for etching features in the layer, using the etchant gas wherein the features in the layer have a third CD. The computer readable code for providing a control layer comprises computer readable code for providing a control layer gas from the control layer gas source to the plasma processing chamber enclosure and computer readable code for transforming the control layer gas into a plasma. The computer readable code for providing at least two deposition cycles comprises computer readable code for providing a flow of a deposition gas from the deposition gas source to the plasma processing chamber enclosure, computer readable code for transforming the deposition gas into a plasma, computer readable code for stopping the flow of the deposition gas from the deposition gas source to the plasma processing chamber enclosure, computer readable code for providing a flow of a profile shaping gas from the profile shaping gas source to the plasma processing chamber enclosure after the flow of the deposition gas is stopped, computer readable code for transforming the profile shaping gas into a plasma, and computer readable code for stopping the flow of the profile shaping gas from the profile shaping gas source to the plasma processing chamber enclosure.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention provides features with small critical dimensions (CD). More specifically, the invention provides features with CD's that are less than the CD of the photoresist pattern used to etch the feature.

Figure 1A:
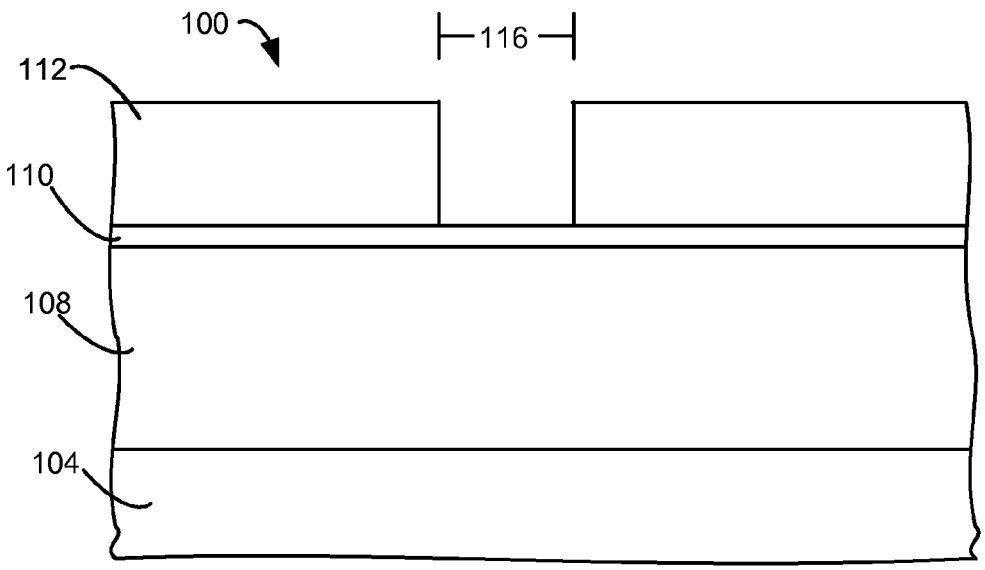
FIGS. 1A-B are schematic cross-sectional views of a stack etched according to the prior art.
Figure 1B:
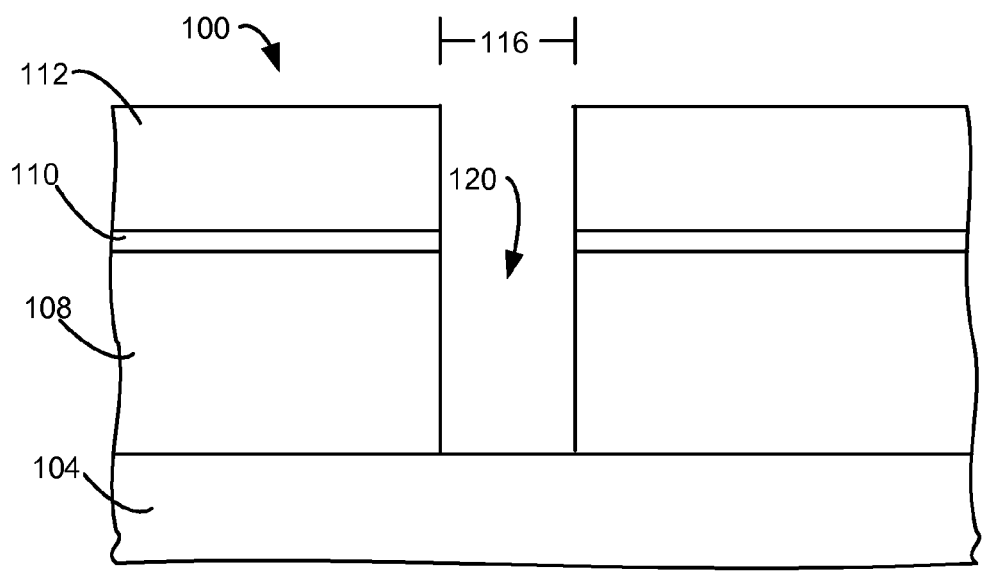
Figure 2:
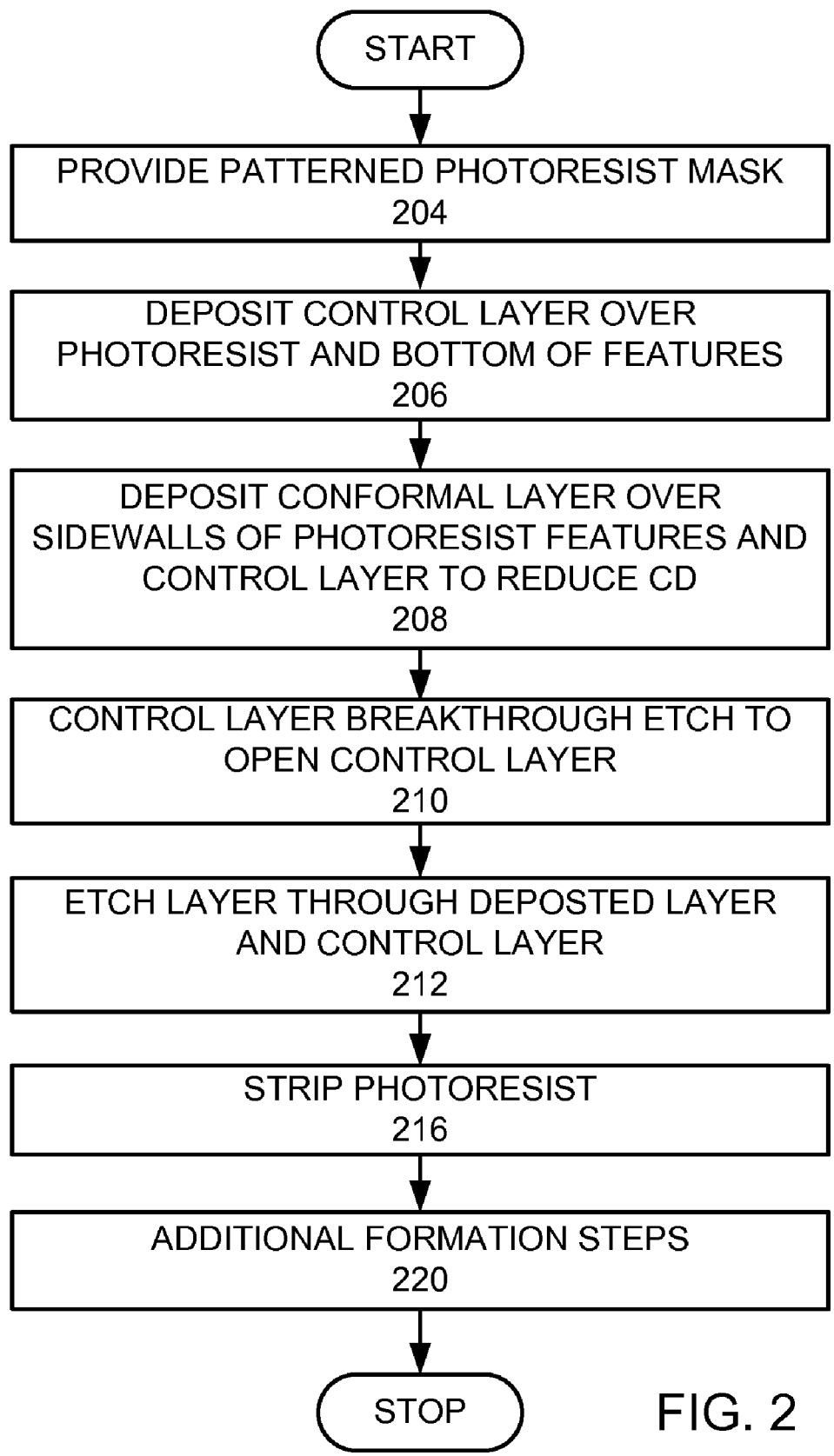
FIG. 2 is a high level flow chart of a process that may be used in an embodiment of the invention.
Figure 3A:
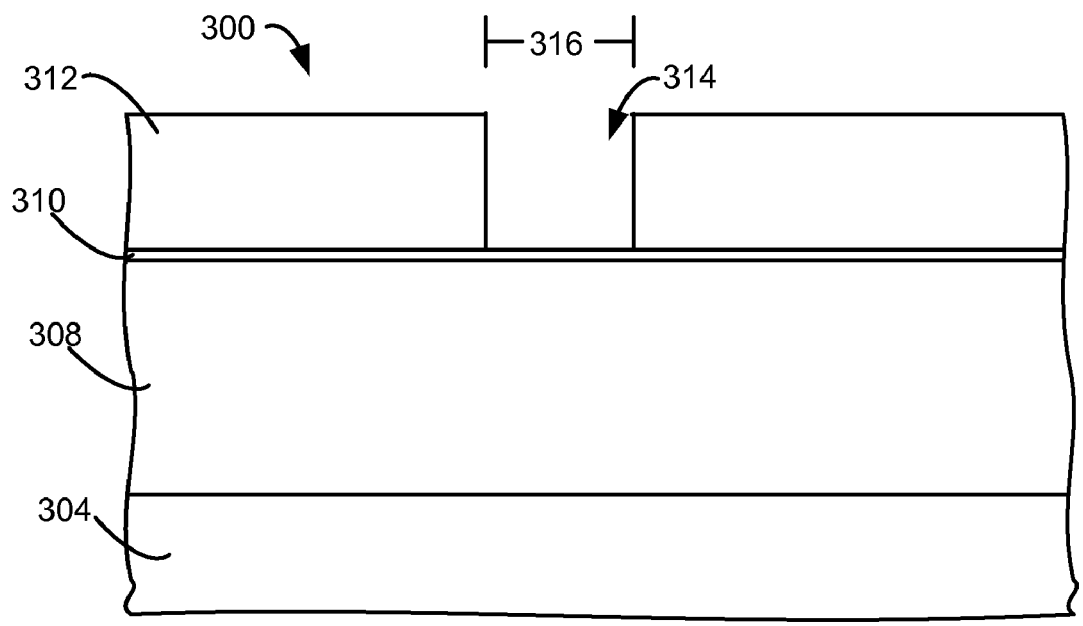
FIGS. 3A-E are schematic cross-sectional views of a stack processed according to an embodiment of the invention.

To facilitate understanding, FIG. 2 is a high level flow chart of a process that may be used in an embodiment of the invention. A patterned photoresist mask is provided (step 204). FIG. 3A is a schematic cross-sectional view of a layer to be etched 308 over a substrate 304, with a patterned photoresist mask 312 with a feature 314, over a ARL 310, over the layer 308 to be etched forming a stack 300. The photoresist mask has a photoresist feature critical dimension (CD), which may be the widest part of the width 316 of the smallest possible feature. Presently, for 248 nm photoresist a typical CD for the photoresist may be 230-250 nm, using conventional processes.

Figure 3B:
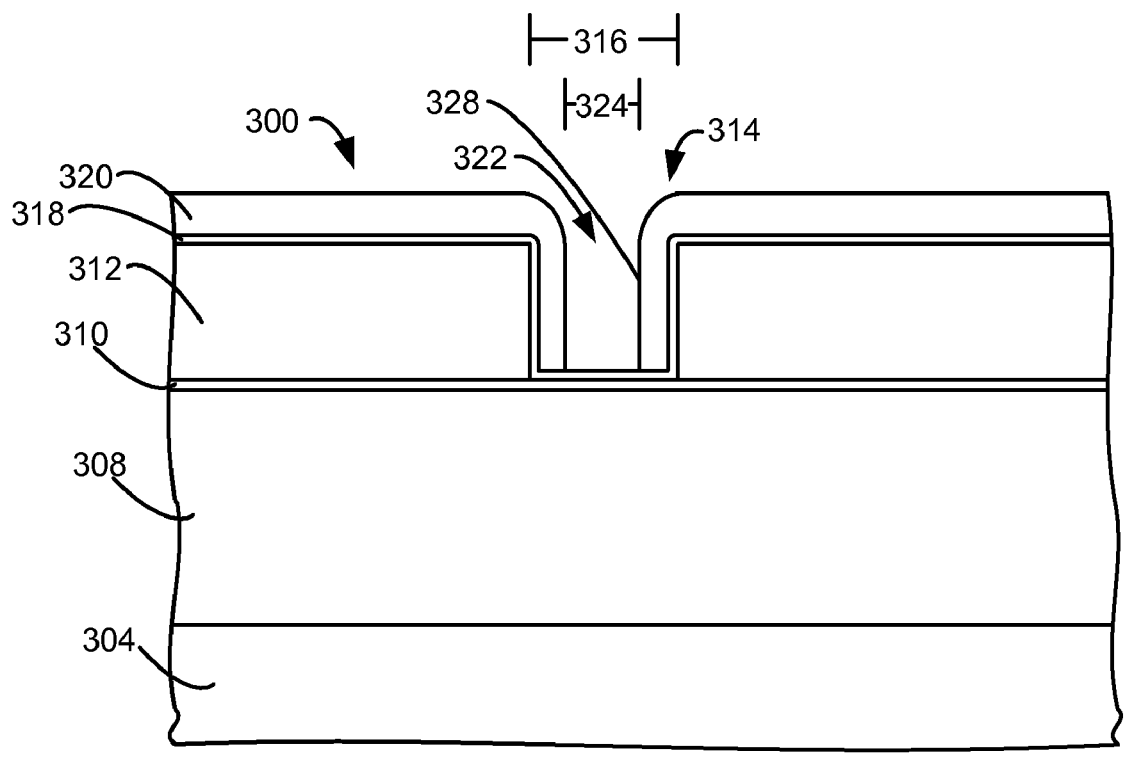

A control layer is then deposited over the photoresist mask and the bottom of the photoresist features (step 206). FIG. 3B is a schematic cross-sectional view of the patterned photoresist mask 312 with a control layer 318 deposited over the photoresist mask 312 and exposed parts of the etch layer 310 at the bottom of the photoresist feature 314.

A conformal layer is then deposited over the sidewalls of the photoresist features and the control layer to reduce the CD (step 208). The conformal deposited layer 320 forms a deposited layer feature 322 within the photoresist feature 314, where the deposited layer feature 322 has a reduced CD 324 that is less than the CD 316 of the photoresist feature 314. Preferably, the reduced CD 324 of the deposited layer feature 322 is at least 30% less than the CD 316 of the photoresist feature (i.e. not greater than 70% of the CD 316 of the photoresist feature). More preferably, the reduced CD 324 of the deposited layer feature 322 is at least 40% less than the CD 316 of the photoresist feature (i.e. not greater than 60% of the CD 316 of the photoresist feature). Most preferably, the reduced CD 324 of the deposited layer feature 322 is at least 50% less than the CD 316 of the photoresist feature (i.e. not greater than 50% of the CD 316 of the photoresist feature). For example, the deposited layer feature may have a reduced CD 316 that is 99% less than the CD 316 of the photoresist feature. It is also desirable that the deposited layer feature 322 has substantially vertical sidewalls 328, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a breadloafing formation, which provide non-substantially vertical sidewalls. Tapered sidewalls (from the faceting formation) or bread-loafing sidewalls may increase the deposited layer CD and provide a poor etching mask. Preferably, the deposition on the sidewall is thicker than the deposition on the bottom of the photoresist feature. More preferably, no layer is deposited over the control layer at the bottom of the photoresist feature, as shown in FIG. 3B. However, in the case that a deposited layer exists at the bottom of the photoresist feature, a polymer breakthrough etch step will etch this polymer deposited at the bottom of the photoresist feature.

Figure 3C:
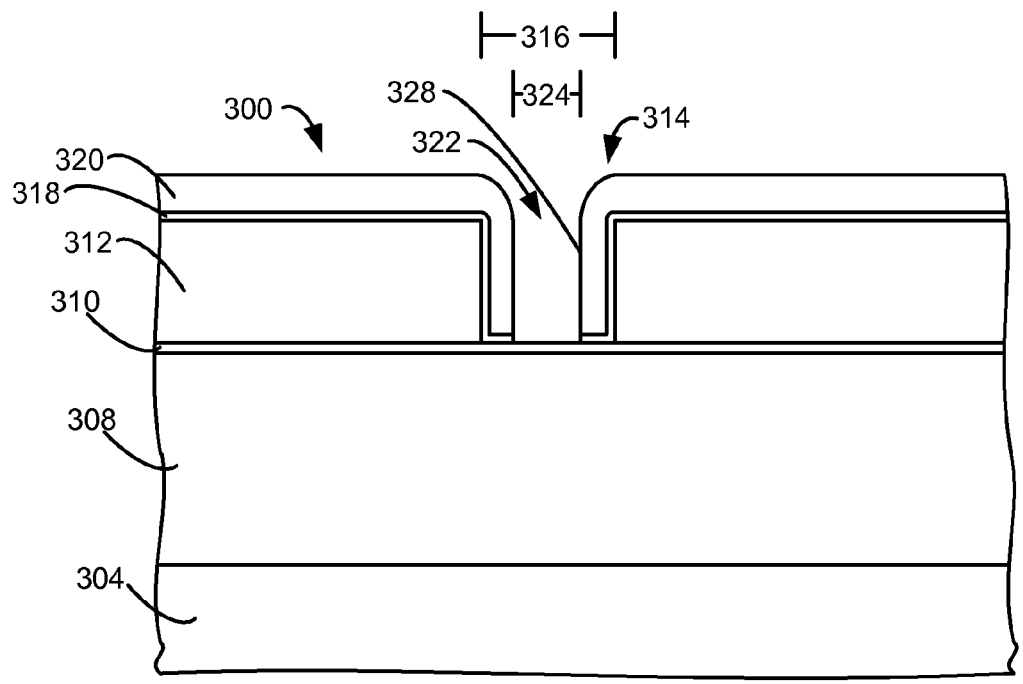

A control layer breakthrough etch is then provided to open the control layer (step 210). Preferably, the control layer breakthrough etch is vertical through the control layer 318 and selectively etches the control layer 318 without appreciably etching the deposited layer 320 laterally. There might be some recess of the ARC 310 and the layer 308 after completion of breakthrough etch. FIG. 3C shows the control layer 318 after the breakthrough etch is completed.

Figure 3D:
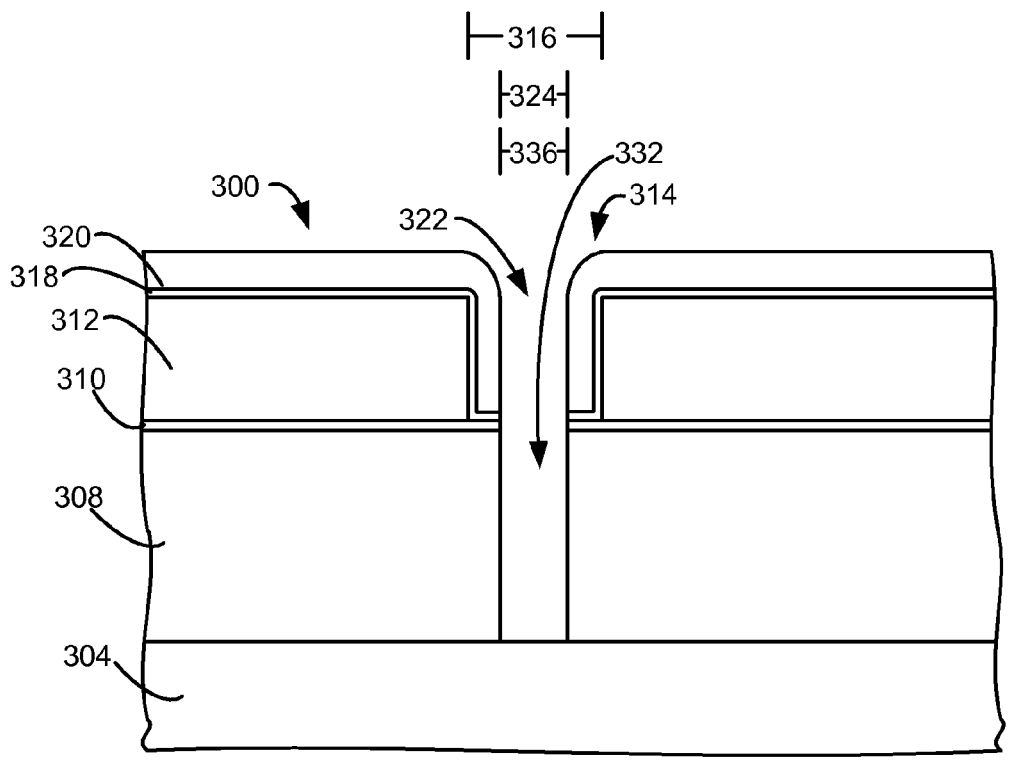

Features are then etched into the layer to be etched 308 through the deposited layer features 322 and the control layer (step 212) with a main etch process. Preferably, the main etch process is an etch process to which the control layer is more etch resistant, so that the main etch process more selectively etches the etch layer than the control layer and so that the control layer is more etch resistant than the deposited layer 320. FIG. 3D shows a feature 332 etched into the layer to be etched 308. In this example, the feature 332 etched in the layer to be etched 308 has a CD 336, which is equal to the CD 324 of the deposited layer feature 322. In practice, the CD 336 of the feature 332 may be slightly larger than the CD 324 of the feature 322 of the deposited layer 320. However, since the CD 324 of the deposited layer feature 322 is significantly smaller than the CD 316 of the photoresist 312, the CD 336 of the feature 332 in the layer to be etched 308 is still smaller than the CD 316 of the photoresist 312. Preferably, the CD 336 of the feature 332 etched in the layer to be etched 308 is at least 30% less than the CD 316 of the photoresist feature. More preferably, the CD 336 of the feature 332 etched in the layer to be etched 308 is at least 40% less than the CD 316 of the photoresist feature. Most preferably, the CD 336 of the feature 332 etched in the layer to be etched 308 is at least 50% less than the CD 316 of the photoresist feature.

Figure 3E:
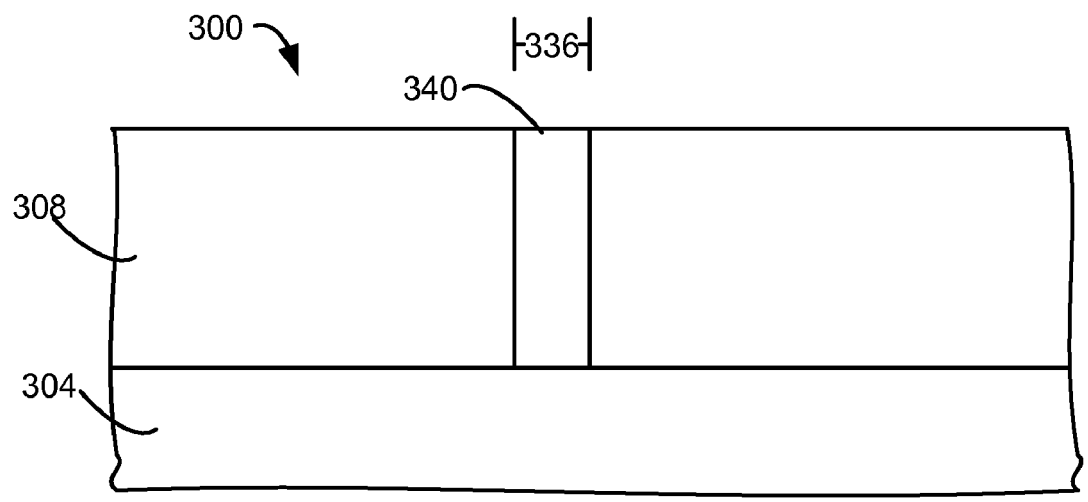

The ARC, photoresist, control layer, and deposited layer may then be stripped (step 216). This may be done as a single step or more than one step with separate deposited layer removal and photoresist strip steps. Ashing may be used for the stripping process. FIG. 3E shows the stack 300 after the deposited layer, control layer, and photoresist mask have been removed. Additional formation steps may be performed (step 220). For example, a contact 340 may then be formed in the feature. To provide a dual damascene structure, a trench may be etched before the contact is formed. Additional processes may be performed after the contact is formed.

Since the control layer 318 is more etch resistant to the main etch than the deposited layer 320, the aperture through the control layer acts as an etch mask that helps to reduce line edge roughening in the case of a line and space pattern and to reduce striation in the case of a via/hole pattern.

Figure 4:
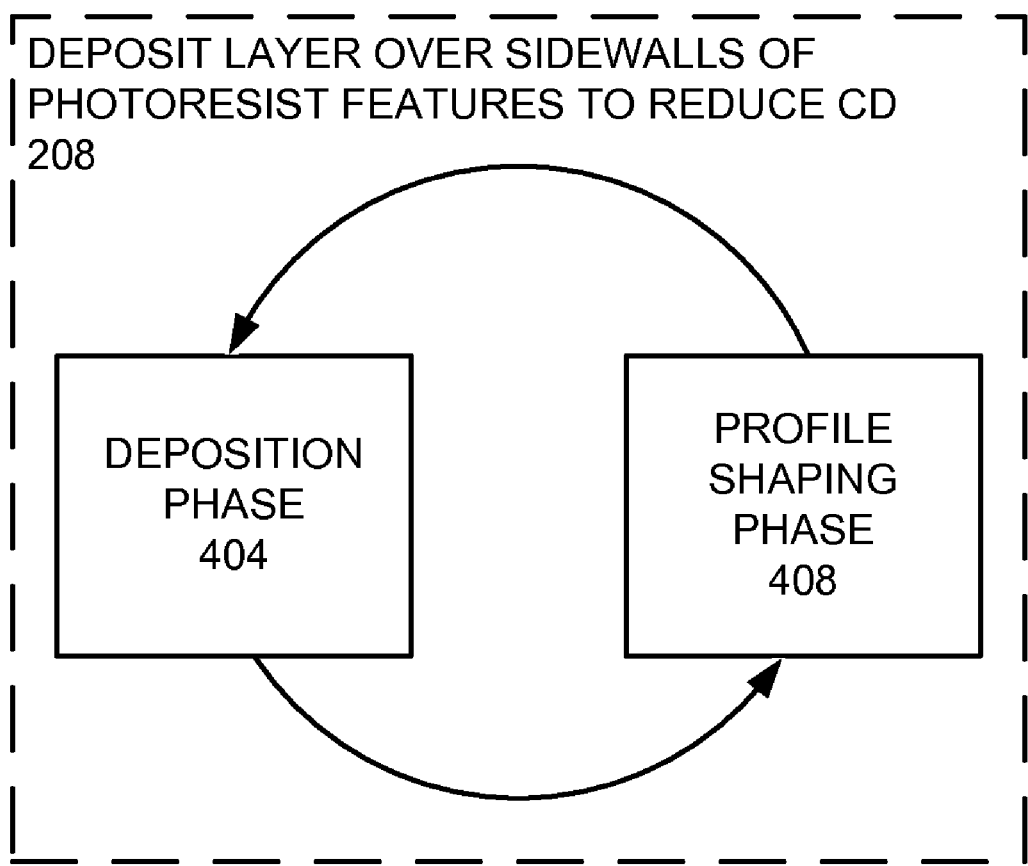
FIG. 4 is a more detailed flow chart of the step of depositing a layer over sidewalls of photoresist features to reduce CD.

FIG. 4 is a more detailed flow chart of the deposit layer over sidewalls of photoresist features to reduce CD step 208. In the embodiment, the deposit layer over sidewalls of photoresist features to reduce CD step 208 comprises a deposition phase 404 and a profile shaping phase 408. If the CD 324 of the deposited layer was only slightly smaller than the CD of the photoresist, or if the deposited layer was faceted or bread loafed, then the CD of the layer to be etched might not be smaller than the CD of the photoresist. In addition, a faceted or bread-loafing deposited layer may cause a faceted or irregularly shaped feature in the layer to be etched. It is also desirable to minimize deposition on the bottom of the photoresist feature. The two phase deposition shown in FIG. 4 for a plurality of cycles provides a conformal layer that reduces faceting and bread loafing and may be used to prevent deposition on the bottom of the photoresist feature.

Example of Dielectric Etch

Figure 5:
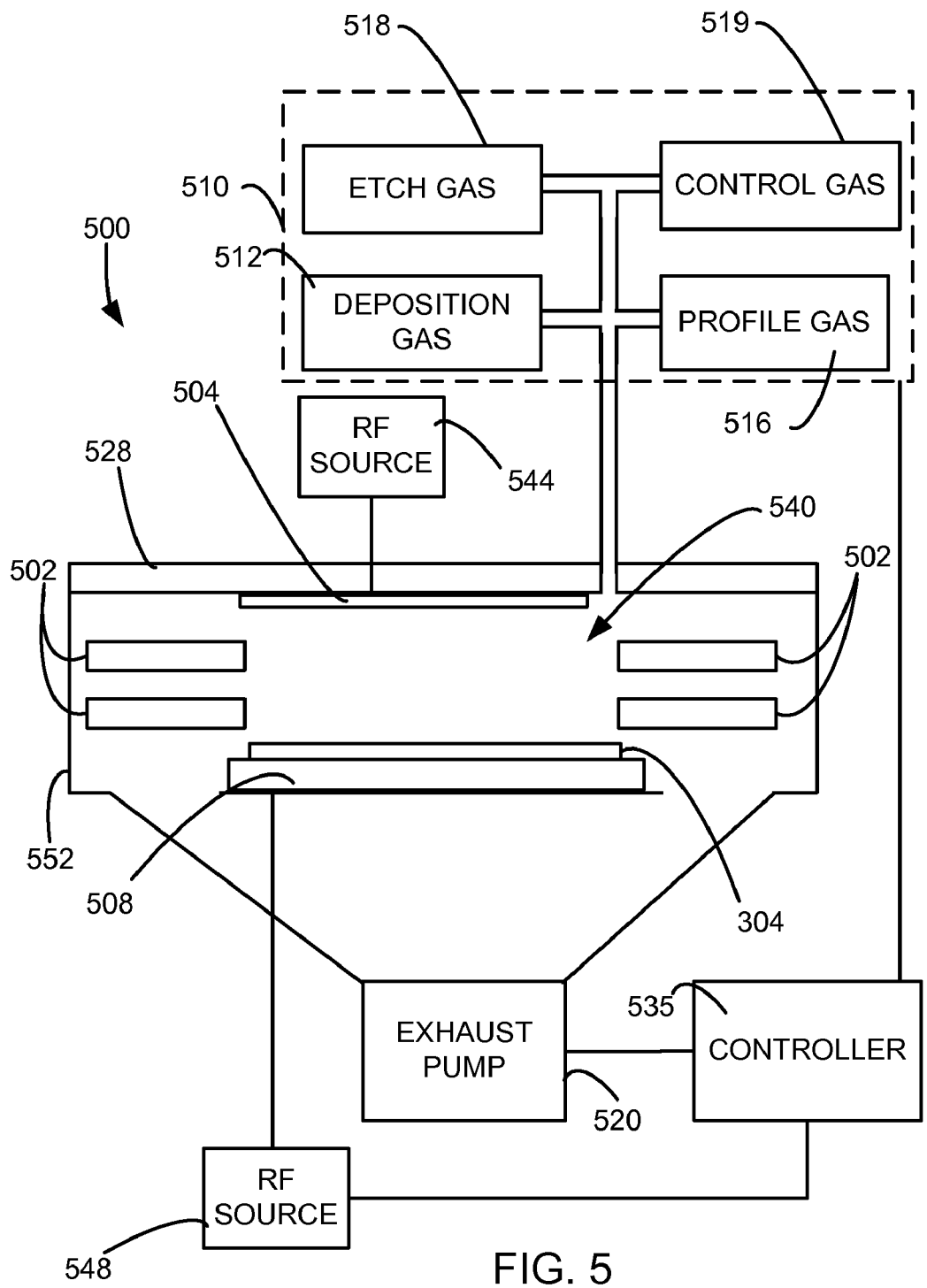
FIG. 5 is a schematic view of a plasma processing chamber that may be used in practicing the invention.

In this example a dielectric layer such as silicon oxide, silicon nitride, silicon carbide, or low-k dielectric (OSG, porous low-k) material forms the etch layer. In other embodiments, the etch layer may be a conductor such as Si, metal and poly-Si. FIG. 5 is a schematic view of a plasma processing chamber 500 that may be used for depositing the control layer, depositing the conformal layer, breaking through the control layer, etching the etch layer, and stripping. The plasma processing chamber 500 comprises confinement rings 502, an upper electrode 504, a lower electrode 508, a gas source 510, and an exhaust pump 520. The gas source 510 comprises a first deposition gas source 512, a profile shaping gas source 516, and a control layer gas source 519. The gas source 510 may comprise additional gas sources, such as an etching gas source 518. Within plasma processing chamber 500, the substrate 304 is positioned upon the lower electrode 508. The lower electrode 508 incorporates a suitable substrate chucking mechanism (e.g., electrostatic, mechanical clamping, or the like) for holding the substrate 304. The reactor top 528 incorporates the upper electrode 504 disposed immediately opposite the lower electrode 508. The upper electrode 504, lower electrode 508, and confinement rings 502 define the confined plasma volume. Gas is supplied to the confined plasma volume by the gas source 510 and is exhausted from the confined plasma volume through the confinement rings 502 and an exhaust port by the exhaust pump 520. A first RF source 544 is electrically connected to the upper electrode 504. A second RF source 548 is electrically connected to the lower electrode 508. Chamber walls 552 surround the confinement rings 502, the upper electrode 504, and the lower electrode 508. Both the first RF source 544 and the second RF source 548 may comprise a 60 Mhz power source, 27 MHz power source and a 2 MHz power source. Different combinations of connecting RF power to the electrode are possible. In the case of Exelan HPT™, which is basically the same as an Exelan HP with a Turbo Pump attached to the chamber, made by Lam Research Corporation™ of Fremont, Calif., which may be used in a preferred embodiment of the invention, the 60 MHz, 27 MHz and 2 MHz power sources make up the second RF power source 548 connected to the lower electrode, and the upper electrode is grounded. A controller 535 is controllably connected to the RF sources 544, 548, exhaust pump 520, and the gas source 510. The Exelan HPT or 2300 DFC system would be used when the layer to be etched 308 is a dielectric layer, such as silicon oxide or organo silicate glass.

Figure 6A:
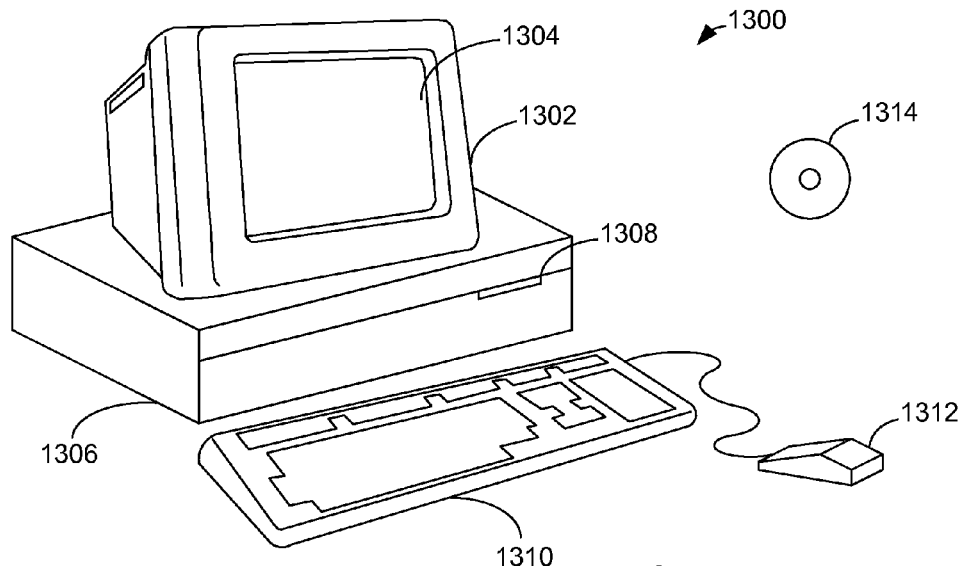
FIGS. 6A-B illustrate a computer system, which is suitable for implementing a controller used in embodiments of the present invention.
Figure 6B:
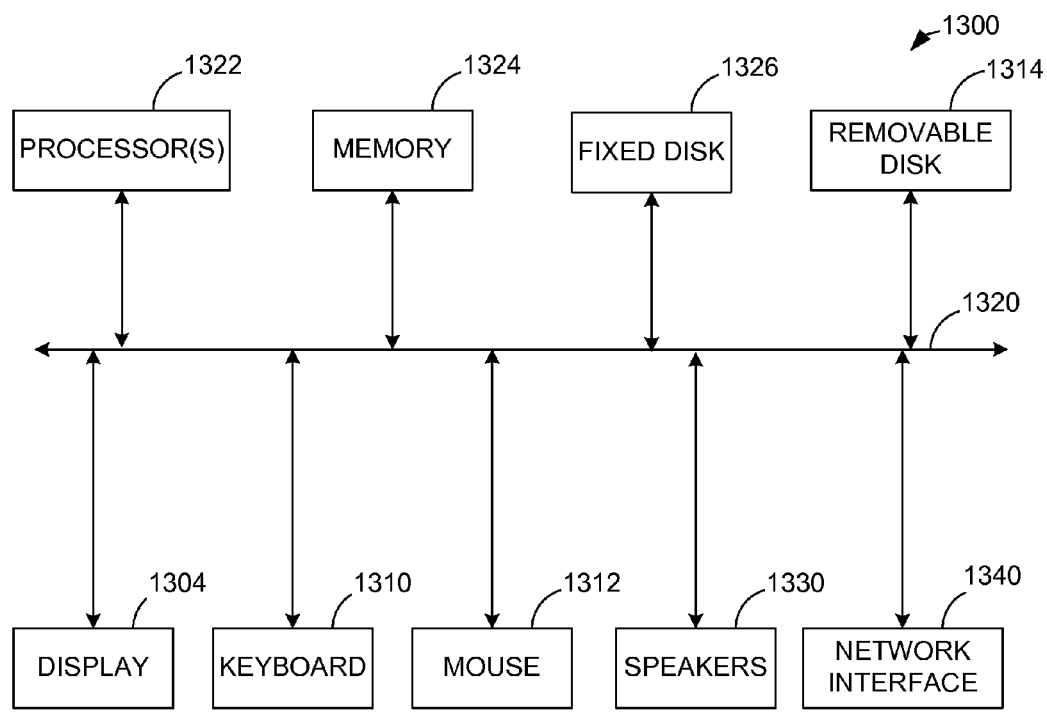

FIGS. 6A and 6B illustrate a computer system 1300, which is suitable for implementing a controller 535 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 6B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk)

that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an example of providing a control layer 206 a chemistry of 100 sccm (standard cubic centimeters per minute) $C_2H_4$ is provided at a pressure of 44 mTorr, established by setting a Vat valve of the turbo pump to 55. A 60 MHz RF source provides 80 Watts of power. The process is maintained for 40-50 seconds to provide a control layer (step 206). This process forms the control layer 318.

Next, a conformal layer is deposited over the sidewalls of the photoresist features and the control layer (step 208).

One example of a deposition phase 404 may be $CF_4$ deposition using a chemistry of 60 sccm (standard cubic centimeters per minute) Ar, 75 sccm $CF_4$, and 100 sccm $H_2$ at a pressure of 70 mTorr, established by setting a Vat valve of the turbo pump to 1000. The 27 MHz RF source provides 800 Watts of power, while the 2 MHz RF source provides 400 Watts of power. This phase is maintained for about 12 seconds One example of a profile shaping phase 408 may use a chemistry of 87 sccm $CF_4$, at a pressure of 25 mTorr, established by setting a Vat valve of the turbo pump to 1000. The 27 MHz RF source provides 800 Watts of power, while the 2 MHz RF source provides 0 Watts of power. This phase is maintained for about 3 seconds.

The cyclic process using the deposition phase 404 and then the shaping phase 408 is performed for 8 cycles.

The ability to control the ratio of times of the deposition phase 404 and the profile shaping phase 408 provide another control variable. A proper ratio will provide substantially vertical and conformal sidewalls as illustrated in FIG. 3B. Such a deposition layer is also able to protect the photoresist mask to increase etch selectivity. Other control parameters provided by the invention that can be used to control the deposition profiles are: number of cycles, total deposition time, deposition/profile shaping time ratio, gas chemistry ratio (such as $CF_4/H_2$). Other gas chemistries such as $C_4F_6/O_2$ or $CH_3F/N_2$ instead of $CF_4/H_2$ $CH_3F/O_2$ or $CH_3F/N_2$ instead of $CF_4$ etc. may be used.

The ability to form features with smaller critical dimensions, without changing the photoresist, allows for smaller features without purchasing new lithography equipment. If newer generations of photoresist are used, the invention provides small CDs for the newer generations of photoresist.

In other embodiments, three or more different gas chemistries may be used providing three or more different deposition phases.

A control layer breakthrough etch is provided to open the control layer (step 212). An example of a control layer breakthrough etch would use a chemistry of 87 sccm $CF_4$ at a pressure of 120 mTorr. The 27 MHz RF source provides 800 Watts of power, while the 2 MHz RF source provides 0 Watts of power. This is maintained for about 55 to 65 seconds.

A main etch is then provided to etch features into the etch layer through the control layer and deposited layer (step 216). In this example an etch chemistry of 500 sccm Ar, 400 sccm $N_2$, 60 sccm $CF_4$, and 70 sccm $H_2$ is provided at a pressure of 70 mTorr. The 27 MHz RF source provides 160 Watts of power, while the 2 MHz RF source provides 100 Watts of power. This is maintained for about 8 seconds.

After the main etch is completed the photoresist, deposited layer, and control layer may be stripped (step 216). A strip chemistry of 200 sccm $O_2$ is provided at 10 mTorr. The 27 MHz RF source provides 300 Watts of power, while the 2 MHz RF source provides 100 Watts of power. This is maintained for about 50 seconds.

The addition of the protective layer (the control layer) has been found to reduce line edge roughening and wine glass formation.

Other embodiments may use a hardmask for the mask. In such embodiments, a photoresist mask may be used to open a hardmask. The deposition layer may be placed over the hardmask to reduce the spacing. In the alternative, the deposition layer may be placed over the photoresist before etching the hardmask.

In the preferred embodiment, the control layer is a layer that has a lower concentration of fluorine than the deposition layer. More preferably, the control layer is a polymer layer with a lower concentration of fluorine than the deposition layer, which is a polymer layer with a higher concentration of fluorine. Most preferably, the control layer is a fluorine free polymer layer. The fluorine free polymer may be called an amorphous carbon layer or a hydrocarbon polymer, where the deposition layer would be a hydrofluorocarbon polymer. To deposit a fluorine free polymer deposition gases such as $C_2H_4$, $CH_4$, or CO without any fluorine component may be used. Where the control layer has some fluorine but less than the deposition layer $CH_3F$ may be used to form the deposition layer.

It has been found that the absence of the control layer causes what is called a 'wine glass formation', where the area formed by the entire photoresist feature is at least slightly etched. In addition to reducing line edge roughening, the control layer has been found to reduce or eliminate wine glass formation.

In other embodiments, the etch layer may be a conductor such as Si, metal and poly-Si. Therefore the inventive process may be used to etch several kinds of films which may be dielectric, such as oxide, nitride, carbide, low-k, etc. or which may be conductor materials, such as Si, polysilicon, metal, etc. The inventive etch may be used to form vias (holes) or trenches (line and space).

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for forming a feature in an etch layer, wherein the etch layer is supported by a substrate and wherein the etch layer is covered by a photoresist mask with photoresist features with a first CD, comprising:
    a plasma processing chamber, comprising:
        a chamber wall forming a plasma processing chamber enclosure;
        a substrate support for supporting a substrate within the plasma processing chamber enclosure;
        a pressure regulator for regulating the pressure in the plasma processing chamber enclosure;
        at least one electrode for providing power to the plasma processing chamber enclosure for sustaining a plasma;
        a gas inlet for providing gas into the plasma processing chamber enclosure; and
        a gas outlet for exhausting gas from the plasma processing chamber enclosure;
    a gas source in fluid connection with the gas inlet, comprising
        a control layer gas source;
        a deposition gas source;
        a profile shaping gas source; and
        an etchant gas source;
    a controller controllably connected to the gas source and the at least one electrode, comprising:
        at least one processor; and
        computer readable media, comprising:
            computer readable code for providing a control layer; comprising:
                computer readable code for providing a control layer gas from the control layer gas source to the plasma processing chamber enclosure; and
                computer readable code for transforming the control layer gas into a plasma;
            computer readable code for providing at least two deposition cycles to form a sidewall deposition on a photoresist mask and the control layer to form features with a second CD, within the photoresist features, comprising:
                computer readable code for providing a flow of a deposition gas from the deposition gas source to the plasma processing chamber enclosure;
                computer readable code for transforming the deposition gas into a plasma;
                computer readable code for stopping the flow of the deposition gas from the deposition gas source to the plasma processing chamber enclosure;
                computer readable code for providing a flow of a profile shaping gas from the profile shaping gas source to the plasma processing chamber enclosure after the flow of the deposition gas is stopped;
                computer readable cod for transforming the profile shaping gas into a plasma; and
                computer readable code for stopping the flow of the profile shaping gas from the profile shaping gas source to the plasma processing chamber enclosure;
            computer readable code for providing a flow of an etchant gas from the etchant gas source to the plasma processing chamber after completion of the at least two deposition cycles; and
            computer readable code for etching features in the layer, using the etchant gas wherein the features in the layer have a third CD.

2. The apparatus, as recited in claim 1, further comprising:
a break through gas source;
computer readable code for providing a breakthrough gas different from the etchant gas, the profile shaping gas, and the deposition gas; and
computer readable code for forming openings in the control layer using the breakthrough gas.

3. The apparatus, as recited in claim 2, wherein the deposition gas is fluorine free.

4. The apparatus, as recited in claim 3 wherein the control layer gas source comprises a hydrocarbon or hydrofluorocarbon gas source.

5. The apparatus, as recited in claim 3 wherein the control layer gas source comprises a hydrocarbon gas source.

* * * * *